United States Patent [19]

Kasa

[11] Patent Number: 4,856,082

[45] Date of Patent: Aug. 8, 1989

[54] RECEPTION SENSITIVITY CONTROL SYSTEM IN A SWEEPING RECEIVER

[75] Inventor: Koichi Kasa, Saitama, Japan

[73] Assignee: Pioneer Electronic Corporation, Japan

[21] Appl. No.: 87,116

[22] Filed: Aug. 19, 1987

[30] Foreign Application Priority Data

Aug. 19, 1986 [JP] Japan .................................. 61-194448

[51] Int. Cl.⁴ ............................................ H04B 11/16
[52] U.S. Cl. ..................................... 455/161; 455/249; 455/254
[58] Field of Search ............... 455/161, 164, 165, 167, 455/185, 186, 214, 216, 263, 264, 249, 200, 254, 182, 183; 331/4

[56] References Cited

U.S. PATENT DOCUMENTS

| | | | |
|---|---|---|---|
| 4,355,414 | 10/1982 | Inoue | 455/249 |
| 4,607,215 | 8/1986 | Takano et al. | 455/249 |
| 4,619,002 | 10/1986 | Thro | 455/254 |
| 4,727,591 | 2/1988 | Manlove | 455/164 |

FOREIGN PATENT DOCUMENTS

| | | |
|---|---|---|
| 0032878 | 3/1985 | European Pat. Off. . |
| 2345649 | 9/1985 | Fed. Rep. of Germany . |
| 2104744 | 6/1980 | United Kingdom . |
| 2006577 | 10/1982 | United Kingdom . |

OTHER PUBLICATIONS

Patent Abstracts of Japan, vol. 9, No. 31 (E-295) [1754] Feb. 9, 1985.
(English translation of an abstract of Japanese Kokai 59-174014).

Primary Examiner—Robert L. Griffin
Assistant Examiner—Curtis Kuntz
Attorney, Agent, or Firm—Sughrue, Mion, Zinn, Macpeak & Seas

[57] ABSTRACT

A reception sensitivity control system in a sweeping receiver in which a frequency dividing ratio of a phase lock loop is instantly changed from one end of the band to the other. The number of receivable stations is counted in the period of time required for the phase lock loop to adjust. If the number of stations is less than a preset minimum, the input sensitivity is increased. Thereafter, the channels are selected.

6 Claims, 3 Drawing Sheets

RECEPTION SENSITIVITY CONTROL SYSTEM IN A SWEEPING RECEIVER

BACKGROUND OF THE INVENTION

1. Field of the Invention

The present invention relates to a system for controlling reception sensitivity in a radio receiver. It particularly relates to a reception sensitivity control system in a sweeping receiver capable of performing preset channel selection.

2. Background of the Invention

A sweeping receiver capable of performing preset channel selection typically includes a receiving station memory system. There has been known such a memory system in which a reception signal is detected by use of a reception station search function such as scanning, seeking, or the like. The reception signal frequency is swept in advance. Upon detection of the reception signal, the sweeping is temporarily stopped and a frequency signal corresponding to the reception frequency at that time is stored in a memory. Thereafter, sweeping is restarted so that reception stations are successively preset.

Japanese Patent Unexamined Publication No. 59-159019 disclosed such a sweeping receiver in which reception sensitivity is lowered in a period of sweeping so as to prevent sweeping from being erroneously stopped owing to noise or the like at a position where no station is located. When no station can be detected in a period of sweeping, the reception sensitivity is increased and the frequency sweeping is repeated. When a sweeping receiver in which reception sensitivity is controlled by such a conventional reception sensitivity control system is additionally provided with a preset channel selection function by means of the above mentioned receiving station memory system, there has been such a disadvantage that the number of preset receiving stations may be so small in comparison with the storage capacity of the memory that there occurs an address in which no receiving station is stored. Therefore, channel selection cannot be attained even if a channel selection switch is operated.

SUMMARY OF THE INVENTION

The present invention is intended to eliminate such a drawback in the conventional reception sensitivity control system. Therefore an object thereof is to provide a reception sensitivity control system in a sweeping receiver which prevents the presetting of a number of receiving stations which is small in comparison with the memory capacity.

The reception sensitivity control system in a sweeping receiver, according to the present invention, has such features that the frequency-dividing ratio of the frequency divider is instantly changed in response to an instruction from one to the other of two values respectively corresponding to a maximum value and a minimum value within a predetermined reception frequency band. The number of times when the level of the reception signal becomes equal to or larger than a predetermined level within a predetermined period of time is counted. When the number of times is smaller than a predetermined numerical value the reception sensitivity is made higher by a predetermined value.

DETAILED DESCRIPTION OF THE PREFERRED EMBODIMENTS

Referring to the accompanying drawings, an embodiment of the present invention will be described in detail hereunder.

Figure 1:
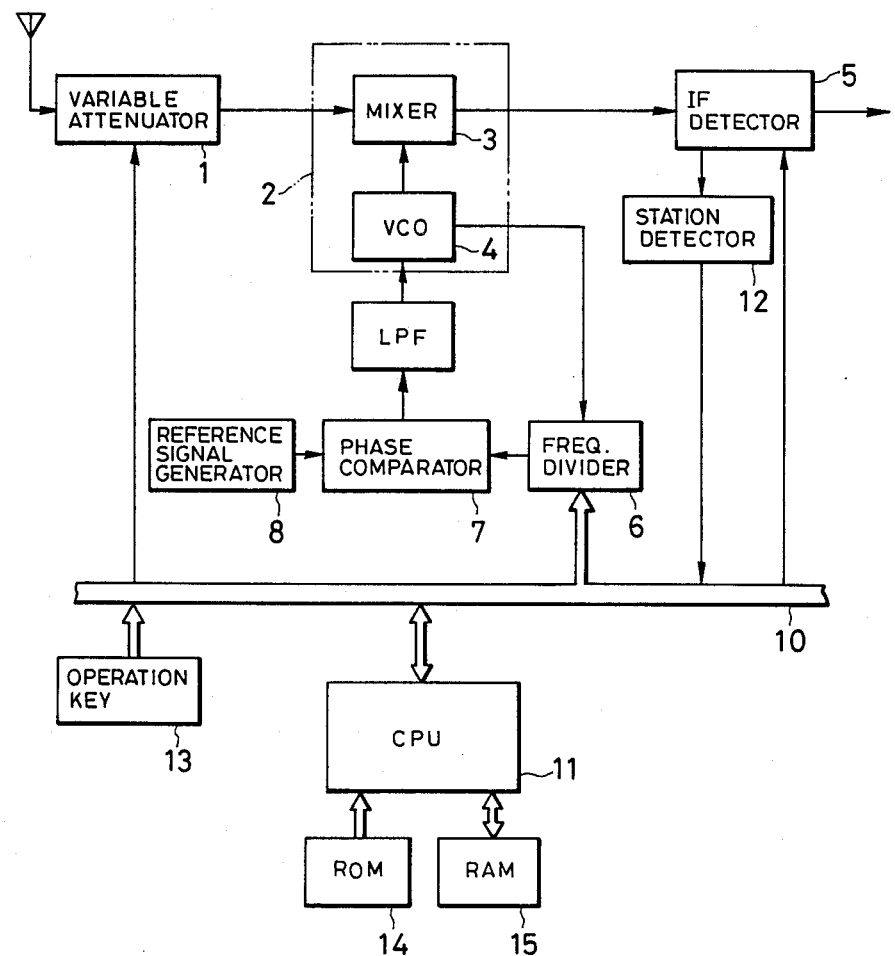
FIG. 1 is a block diagram showing an embodiment of the present invention.

In FIG. 1, an RF (high frequency) reception signal from an antenna is fed to a front end 2 through a variable attenuator 1. In the front end 2, the RF reception signal is mixed in a mixer 3 with a local oscillation signal from a VCO (voltage-controlled oscillator) 4 so as to undergo frequency conversion. The output of the mixer 3 is sent out from the front end 2 as an IF (intermediate frequency) signal which is fed to an IF detection circuit 5 having an IF amplification function as well as a detection function. An audio signal is produced from the IF detection circuit 5 and fed to a power amplifier or the like.

On the other hand, an oscillation output of the VCO 4 in the front end 2 is fed to a frequency divider 6. The frequency divider 6 is so arranged as to frequency divide its input according to a designated frequency-dividing ratio. The oscillation output of the VCO 4, the frequency of which has been divided by the frequency divider 6, is fed to a phase comparator 7 so as to be phase-compared with a reference signal from a reference signal generator 8. As a result, a signal is produced from the phase comparator corresponding to a phase difference between the oscillation output and the reference signal. The output of the phase comparator 7 is fed to the VCO 4 as a control signal through an LPF (low pass filter) 9 so that a phase-locked loop is constituted by the VCO 4, the frequency divider 6, the phase comparator 7 and the LPF 9.

Output data of a microcomputer 11 is fed to the variable attenuator 1 and the frequency divider 6 through an I/O (input/output) data bus 10 so as to designate both the amount of signal attenuation in the variable attenuator 1 and the frequency-dividing ratio of the frequency divider 6. The microcomputer 11 is fed with an output of a station detector 12 and an instruction corresponding to a manipulation of an operation key 13 through the I/O data bus 10. The station detector 12 is arranged in such a manner as, for example, to produce a station detection signal and data representing an output level of an IF amplification stage of the IF detection circuit 5 when the output level of the IF amplification stage becomes equal to or larger than a predetermined level. The microcomputer 11 is constituted by a processor for performing data processing in cooperation with a RAM 15 in accordance with a program stored in advance in a ROM 14. A timer measures designated time.

Figure 2:
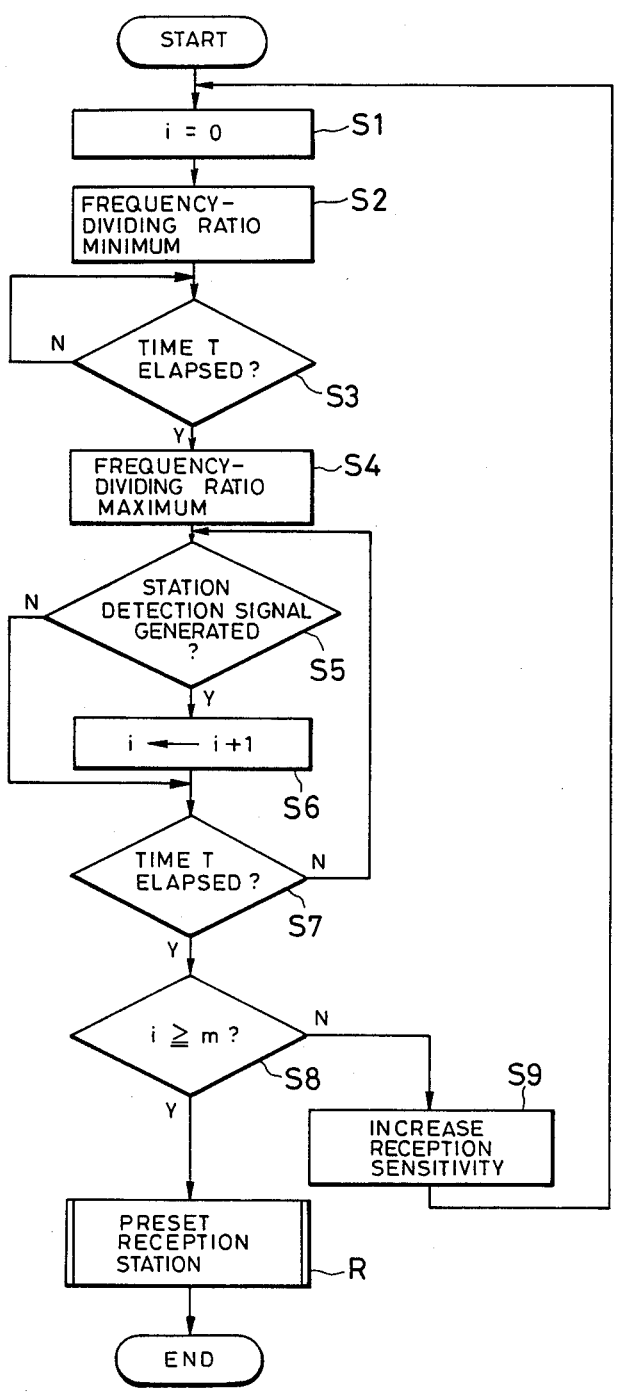
FIG. 2 is a flowchart showing an example of the operation of the apparatus of FIG. 1.

Referring to the flowchart of FIG. 2, the operation of the processor in the thus arranged microcomputer 11 will be described. When a preset command is generated from the operation key 13 during execution of a main routine, the processor resets the content i of a register used as a counter (step S1). Then, the processor sends out data so as to make the frequency-dividing ratio of the frequency divider 6 become a value corresponding to a minimum value within a predetermined reception frequency band (step S2). Then, the processor judges by means of the timer whether a time T has elapsed or not from the designation of the frequency-dividing ratio performed in step S2. The processor repeats the execution of step S3 till the time T has elapsed. If the time T has finally elapsed, the processor shifts the operation to a step S4 and sends out data so as to make the frequency-dividing ratio of the frequency divider 6 become a value corresponding to a maximum value within the predetermined reception frequency band.

Then, the processor judges whether or not a station detection signal has been generated (step S5). If the test in step S5 proves that a station detection signal has been generated, the processor adds "1" to the storage contents i of the register used as the counter (step S6), and shifts the operation to a step S7 in which the processor judges whether or not the time T has elapsed from the designation of the frequency-dividing ratio performed in step S4. If the test in step S4 proves that no station detection signal has been generated, the processor shifts the operation directly to step S7.

If the test in step S7 proves that the time T has not yet elapsed, the processor again executes the processing in the step S5 and following. If the test in step S7 proves that the time T has elapsed, the processor shifts the operation to a step S8 in which the processor judges whether or not the storage contents i of the register used as the counter is equal to or larger than m. If the test in step S8 proves that the storage contents i is smaller than m, the processor sends out data so as to reduce the amount of signal attenuation of the variable attenuator 1 by a predetermined value, that is, to increase the reception sensitivity by a predetermined value (step S9). Then the processor again performs the processing in step S1 and following. If the test in step S8 proves that the storage contents i is equal to or larger than m, the processor shifts its operation to a routine R for performing reception station presetting. In this routine R, the processor performs control so that, for example, reception frequency sweeping is performed while changing the frequency-dividing ratio of the frequency divider 6 step by step. As a result in routine R, when a reception signal of a level equal to or larger than a predetermined value is obtained, the level and frequency of the reception signal is stored in a predetermined area of the RAM 15. Also, when the number of times of occurrence of signals to be stored in a predetermined area of the RAM 15 exceeds the storage capacity of the RAM 15 at the predetermined area and if the minimum one of the stored reception signal levels is smaller than the level of a present reception signal, the level and frequency of the present reception signal is stored as a substitute for those of the reception signal of the minimum level. After execution of this routine R, the processor restarts the execution of the main routine. This routine R is disclosed in detail in Japanese Patent Unexamined Publication No. 59-174014.

Figure 3:
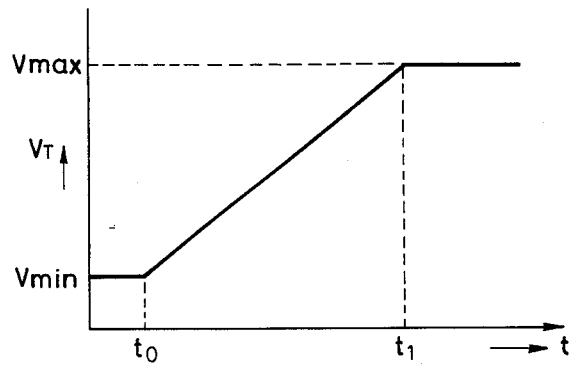
FIG. 3 is a diagram showing the tuning voltage $V_T$ in the apparatus of FIG. 1.

In the above operation, assume that the frequency-dividing ratio of the frequency divider 6 is changed at a point of time $t_1$ from a value corresponding to a minimum value within a predetermined reception frequency band to another value corresponding to a maximum value within the same reception frequency band. Then, as shown in FIG. 3, a tuning voltage $V_T$ produced from the LPF 9 changes gradually from a value $V_{min}$ corresponding to the minimum value within the predetermined reception frequency band to another value $V_{max}$ corresponding to the maximum value within the same reception frequency band at a point in time $t_2$. Accordingly, if the time T is set to a value slightly longer than the time from the point in time $t_1$ to the point in time $t_2$, all the receivable stations within the predetermined reception frequency band can be counted. Accordingly, if the reception sensitivity is changed in accordance with the count value of the obtained reception stations, it is possible to perform the presetting of stations of substantially the same number as the memory capacity.

Figure 4:
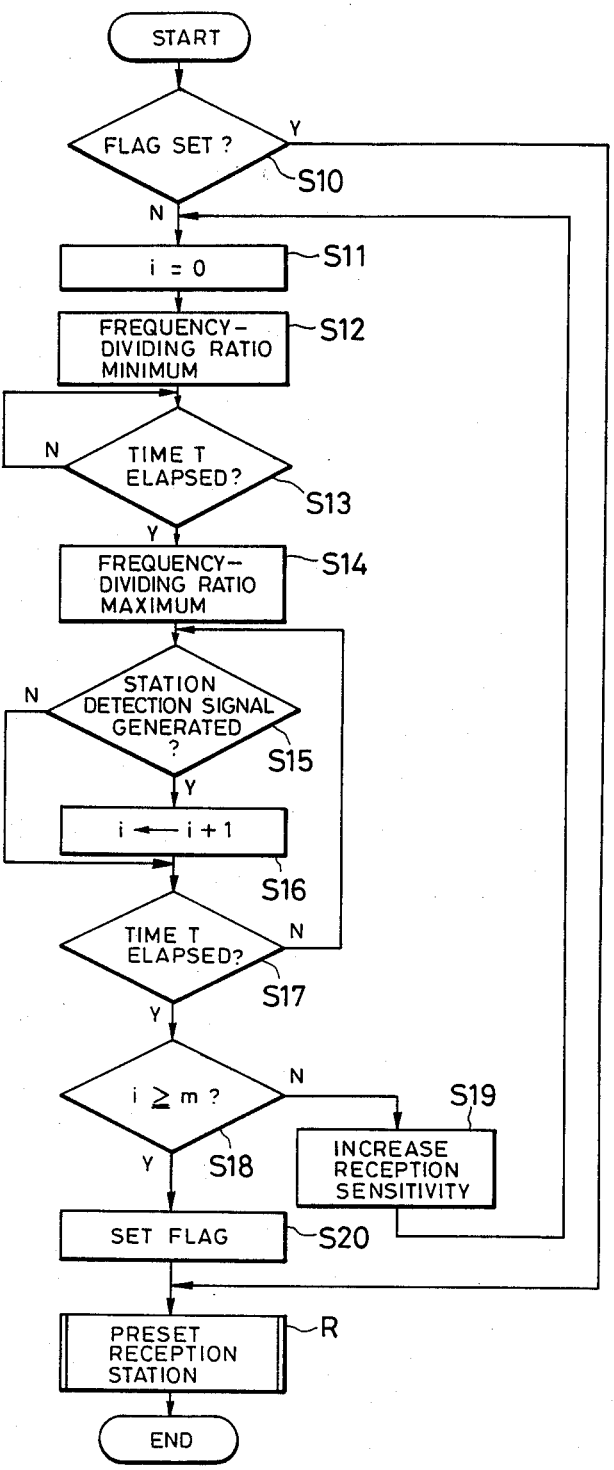
FIG. 4 is a flowchart showing another example of the operation of the apparatus of FIG. 1.

FIG. 4 is a flowchart showing another example of the operation of the processor. In this example, if a preset command is generated during execution of the main routine, the processor judges whether or not a predetermined time has elapsed from the termination of setting of the reception sensitivity on the basis of flag data stored in the RAM 15 at a predetermined address thereof (step S10). If the test of step S10 proves that the predetermined time has not yet elapsed after the alteration of the reception sensitivity, the processor immediately executes the routine R and thereafter restarts the execution of the main routine. If the test in step S10 proves that the predetermined time has elapsed after the alteration of the reception sensitivity, the processor shifts the operation to a step S11. In steps S11 to S19, processing is performed similarly to the steps S1 to S9 of FIG. 2. In step S18, if the test proves that the storage content i is equal to or larger than m, the process writes flag data indicating termination of the reception sensitivity setting in a predetermined address of the RAM 15 (step S20) and thereafter restarts the execution of the main routine after execution of the routine R.

In the above operation, if the resetting of the flag data stored in the predetermined address is performed, for example, by interruption processing when a predetermined time has elapsed after writing of the flag data in step S20, the execution of the steps S11 to S19 can be eliminated until a predetermined time has elapsed from the proper setting of reception sensitivity so as to make it possible to perform the preset operation in a short time.

Although in the above embodiment, the reception sensitivity is increased by changing the amount of signal attenuation in the variable attenuator 1 into a designated value, the reception sensitivity may be increased by a so-called DX/LOCAL reception change-over in which change-over control is performed so as to make the amount of signal attenuation in the variable attenuator 1 become one of two values.

As described above in detail, the reception sensitivity control system in a sweeping receiver, according to the present invention, has such features that the frequency-dividing ratio of the frequency divider is instantly changed, in response to an instruction, from one to the other of two values respectively corresponding to a maximum value and a minimum value within a predetermined reception frequency band. The number of times when the level of the reception signal becomes equal to or larger than a predetermined level within a predetermined period of time following the change is counted so that, when the number of times is smaller than a predetermined numerical value, the reception sensitivity is made higher by a predetermined value. Thereby, it is possible to increase the number of receivable stations to be preset, to facilitate security of preset stations of the number corresponding to the memory capacity, and to perform automatic tuning in a short time.

What is claimed is:

1. A reception sensitivity control system in a sweeping receiver, comprising:
   level adjusting means for receiving a reception signal and for adjusting a level thereof;
   a mixer for receiving an output of said level adjusting means;
   a voltage controlled oscillator for providing an oscillation output as a local oscillation signal for said mixer;
   a frequency divider for frequency dividing an oscillation output of said voltage controlled oscillator according to a frequency dividing ratio;
   a reference signal source;
   a phase comparator for comparing outputs of said frequency divider and said reference signal source, and for providing the comparison as an input to said voltage controlled oscillator;
   first control means for changing said frequency dividing ratio from a first value to a second value, said first and second value corresponding to minimum and maximum frequencies of a predetermined reception frequency band, respectively;
   means for detecting when a level of an output signal from said mixer exceeds a predetermined level;
   means for counting, within a predetermined period, a number of times said detecting means detects said level to exceed said predetermined level; and
   means for increasing said level of said level adjusting means when said counted number is less than a predetermined number.

2. A reception sensitivity control system as recited in claim 1, further comprising channel selection means for selecting receivable channels based on a level of an output of said mixer as said frequency dividing ratio is gradually changed.

3. A reception sensitivity control system as recited in claim 2, wherein said channel selection means operates with said level of said level adjusting means being set at a last level set by said increasing means.

4. The system reception sensitivity control system, as claimed in claim i, wherein said predetermined period occurs after a change in said dividing ratio by said first control means.

5. A reception sensitivity control system in a sweeping receiver, comprising:
   first means for receiving transmitted signals, and for attenuating a level of said received signals;
   second means for detecting when the attenuated level of said received signals is greater than a predetermined level;
   third means for counting, within a predetermined period, a number of times said detecting means detects said received signals having an attenuated level which is greater than said predetermined level; and
   fourth means for decreasing the attenuation of said received signals in said first means only when said counted number is less than a predetermined number.

6. A reception sensitivity control system as recited in claim 5, wherein said predetermined number represents a storage capacity of preset receiving stations.

* * * * *